(12) United States Patent
Nakaya

(10) Patent No.: US 6,992,941 B2
(45) Date of Patent: Jan. 31, 2006

(54) SEMICONDUCTOR MEMORY DEVICE

(75) Inventor: Shuji Nakaya, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 10/727,829

(22) Filed: Dec. 4, 2003

(65) Prior Publication Data

US 2004/0120193 A1 Jun. 24, 2004

(30) Foreign Application Priority Data

Dec. 19, 2002 (JP) ............................. 2002-368744

(51) Int. Cl.
*G11C 7/00* (2006.01)
(52) U.S. Cl. .................. 365/203; 365/204; 365/230.06
(58) Field of Classification Search ................ 365/203, 365/204, 230.06

See application file for complete search history.

(56) References Cited

U.S. PATENT DOCUMENTS

| | | | |
|---|---|---|---|
| 6,130,846 A * | 10/2000 | Hori et al. | ................... 365/203 |
| 6,191,979 B1 | 2/2001 | Uekubo | |
| 6,487,132 B2 * | 11/2002 | Bae et al. | ................... 365/203 |
| 6,490,199 B2 | 12/2002 | Lee et al. | |

* cited by examiner

*Primary Examiner*—Anh Phung
*Assistant Examiner*—Toan Le
(74) *Attorney, Agent, or Firm*—Hamre, Schumann, Mueller & Larson, P.C.

(57) ABSTRACT

There is provided a semiconductor memory device capable of performing high-speed reading even when the current capability of memory cells and transistors for charging is decreased, and a bit line capacitance is increased. In a sense amplifier, in addition to a P-type MOS transistor for charging, a P-type MOS transistor and a N-type MOS transistor are provided as a circuit for charging a selected bit line up to a switching level of a determination inverter included in a circuit for determining data of a memory cell, and a bit line is charged at high speed, whereby a read time is shortened.

3 Claims, 7 Drawing Sheets

SEMICONDUCTOR MEMORY DEVICE

BACKGROUND OF THE INVENTION

1. Field of the Invention

The present invention relates to a semiconductor memory device, and in particular, to a technique of providing a high-speed readable mask ROM.

2. Description of the Related Art

FIG. 6 is a circuit diagram showing a configuration of a contact-type mask ROM as a conventional semiconductor memory device. The contact-type mask ROM has a configuration in which whether or not a drain of a memory cell transistor is connected to a bit line through a contact is associated with "0" and "1" of memory data.

In FIG. 6, the conventional semiconductor memory device is composed of a memory cell array 3, a column decoder 2, a sense amplifier 18, and a charge signal generation circuit 4.

The memory cell array 3 is configured so that memory cells Mij (i=1 to m, J=1 to n) of N-type MOS transistors are arranged in a matrix. Gates of the memory cells Mij are connected respectively to word lines WLi (i=1 to m) commonly in a row direction (memory cells having the same numerical value of i), and sources thereof are grounded. Herein, drains of the memory cells Mij are connected to bit lines BLj (j=1 to n) in the case where memory data is "0", and are not connected to bit lines BLj (j=1 to n) in the case where the memory data is "1".

The column decoder 2 is composed of N-type MOS transistors Cj (j=1 to n). All drains of the N-type MOS transistors Cj (j=1 to n) are commonly connected. Gates thereof are connected respectively to column selection signal lines CLj (j=1 to n), and sources thereof are connected respectively to the bit lines BLj (j=1 to n).

The sense amplifier 18 is composed of a P-type MOS transistor 5 for charging (charging circuit), an inverter 8 for determining output data of the memory cells Mij (determination inverter), and an inverter 9 for buffering an output signal of the inverter 8 (buffering inverter). A gate terminal of the P-type MOS transistor 5 receives a charge control signal NPR of the charge signal generation circuit 4. A source terminal thereof is supplied with a supply voltage VDD, and a drain terminal thereof is connected to a common drain of the N-type MOS transistors Cj (j=1 to n). The inverter 8 receives a signal of the common drain of the N-type MOS transistors Cj (j=1 to n), and determines output data of the memory cells Mij. The inverter 9 receives an output signal from the inverter 8, and outputs memory data of the memory cells Mij.

The charge signal generation circuit 4 receives a dock and an address from outside, and outputs the charge control signal NPR to a gate of the P-type MOS transistor 5 for charging.

Next, the operation of reading data of the memory cell M11, as an example, in the semiconductor memory device configured as described above will be described with reference to FIG. 7. FIG. 7 is a timing chart for signals in respective portions of the sense amplifier 18.

First, among the column selection signal lines CLj (j=1 to n), CL1 is changed to a logic "H" level, and the other CL2 to CLn are changed to a logic "L" level, whereby the N-type MOS transistor C1 is turned on among the transistors constituting the column decoder 2, and the other transistors C2 to Cn are turned off. Furthermore, the word line WL1 is changed from the logic "L" level that is a non-selected state to the logic "H" level that is a selected state, and the other word lines WL2 to WLm are retained to be the logic "L" level that is a non-selected state.

Next, the charge control signal NPR is changed from the logic "H" level to the logic "L" level, and the P-type MOS transistor 5 for charging is turned on.

Herein, in the case where the drain of the memory cell M11 is connected to the bit line BL1, the current capability of the memory cell M11 is larger than that of the P-type MOS transistor 5 for charging. Therefore, an input signal SIN (SIN0) of the inverter 8 becomes lower than a switching level VTH of the inverter 8. An output signal SOUT (SOUT0) of the inverter 8 holds the logic "H" level, and an output signal OUT (OUT0) of the inverter 9 holds the logic "L" level.

On the other hand, in the case where the drain of the memory cell M11 is not connected to the bit line BL1, the bit line BL1 is charged by the P-type MOS transistor 5 for charging, and the input signal SIN (SIN1) to the inverter 8 has a voltage higher than the switching level VTH of the inverter 8. Therefore, the output signal SOUT (SOUT1) of the inverter 8 turns to be the logic "L" level, and the output signal OUT (OUT1) of the inverter 9 turns to be the logic "H" level. At this time, a read time tRD is determined by a time during which the P-type MOS transistor 5 for charging charges the bit line BL1.

The above-mentioned conventional semiconductor memory device has the following problem.

In the case where the memory cells Mij are connected to the bit lines BLj, data are determined by setting the level of the input signal SIN (SIN0) to the inverter 8 to be lower than the switching level VTH of the determination inverter 8 under the condition that the P-type MOS transistor 5 for charging and the memory cell Mij are in a ON state. Therefore, the current capability of the P-type MOS transistor 5 for charging is set to be smaller than that of the memory cells Mij.

In recent years, the current capability of the memory cells Mij has decreased along with the miniaturization of a process and the enhanced performance of equipment. Furthermore, the number of the memory cells Mij to be connected to the bit lines BLj is increased to enhance the bit line capacitance. Along with the decrease in current capability of the memory cells Mij, the current capability of the P-type MOS transistor 5 for charging also is decreased, and the capacitance of the bit lines to be charged by the P-type MOS transistor 5 for charging is increased. Therefore, a charge time is prolonged, which results in a prolonged read time tRD.

SUMMARY OF THE INVENTION

Therefore, with the foregoing in mind, it is an object of the present invention to provide a semiconductor memory device capable of rapidly charging a bit line, and enabling high-speed reading, even when the current capability of a memory cell is decreased, and the capacitance of a bit line is increased.

In order to achieve the above-mentioned object, a first semiconductor memory device of the present invention includes: a memory cell array in which memory cells are arranged in a matrix; a plurality of word lines connecting gate terminals of memory cells commonly in a row direction; a plurality of bit lines connecting drain terminals of memory cells commonly in a column direction; a determination circuit (determination inverter, buffering inverter) for determining data of the memory cells; a column selection circuit (column decoder) for selectively connecting the bit lines to the determination circuit; a charging circuit for charging the bit line selected by the column selection circuit and an input terminal of the determination circuit; and a charge signal generation circuit for controlling the charging circuit. The charging circuit includes: a first charging sub-circuit that is operated when an output signal (NPR) of the charge signal generation circuit is in an active state; and a second charging subcircuit that is operated when the output signal of the charge signal generation circuit is in an active state and a voltage of the selected bit line is lower than a predetermined voltage.

According to the above configuration, until an input signal (SIN) of the determination circuit reaches a switching level (VTH) of the determination circuit, the second charging unit is operated in addition to the first charging unit to charge a selected bit line. After the input signal (SIN) of the determination circuit reaches the switching level (VTH) of the determination circuit, the selected bit line is charged only by the first charging unit.

In order to achieve the above-mentioned object, a second semiconductor memory device of the present invention includes: a memory cell array in which memory cells are arranged in a matrix; a plurality of word lines connecting gate terminals of memory cells commonly in a row direction; a plurality of bit lines connecting drain terminals of memory cells commonly in a column direction; a determination circuit (determination inverter, buffering inverter) for determining data of the memory cells; a column selection circuit (column decoder) for selectively connecting the bit lines to the determination circuit; a charging circuit for charging the bit line selected by the column selection circuit and an input terminal of the determination circuit; and a charge signal generation circuit for controlling the charging circuit. The charging circuit includes: a first transistor (e.g., a P-type transistor for charging) having a source terminal supplied with a supply voltage (VDD), a gate terminal supplied with an output signal (NPR) of the charge signal generation circuit, and a drain terminal connected to an input terminal of the determination circuit; a second transistor (e.g., a P-type transistor) having a source terminal supplied with the supply voltage (VDD) and a gate terminal supplied with the output signal of the charge signal generation circuit; and a third transistor (e.g., a N-type transistor) having a source terminal connected to a drain terminal of the second transistor, a gate terminal connected to the output terminal of the determination circuit, and a drain terminal connected to the input terminal of the determination circuit.

According to the above configuration, until an input signal (SIN) of the determination circuit reaches a switching level (VTH) of the determination circuit, the second transistor is operated via the third transistor in addition to the first transistor to charge a selected bit line. After the input signal (SIN) of the determination circuit reaches the switching level (VTH) of the determination circuit, the selected bit line is charged only by the first transistor.

In order to achieve the above-mentioned object, a third semiconductor memory device of the present invention includes: a memory cell array in which memory cells are arranged in a matrix; a plurality of word lines connecting gate terminals of memory cells commonly in a row direction; a plurality of bit lines connecting drain terminals of memory cells commonly in a column direction; a determination circuit (determination inverter, buffering inverter) for determining data of the memory cells; a column selection circuit (column decoder) for selectively connecting the bit lines to the determination circuit; a charging circuit for charging the bit line selected by the column selection circuit and an input terminal of the determination circuit; and a charge signal generation circuit for controlling the charging circuit. The charging circuit includes: a first transistor (e.g., a P-type transistor for charging) having a source terminal supplied with a supply voltage (VDD), a gate terminal supplied with an output signal (NPR) of the charge signal generation circuit, and a drain terminal connected to an input terminal of the determination circuit; a second transistor (e.g., a P-type transistor) having a source terminal supplied with the supply voltage (VDD) and a gate terminal supplied with the output signal of the charge signal generation circuit; a third transistor (e.g., a N-type transistor) having a source terminal connected to a drain terminal of the second transistor and a drain terminal connected to the input terminal of the determination circuit; and an inverter having an input terminal connected to the input terminal of the determination circuit and an output terminal connected to a gate terminal of the third transistor.

According to the above configuration, until an input signal (SIN) of the inverter reaches a switching level (VTH) of the inverter, the second transistor is operated via the third transistor in addition to the first transistor to charge a selected bit line. After the input signal (SIN) of the inverter reaches the switching level (VTH) of the inverter, the selected bit line is charged only by the first transistor.

In order to achieve the above-mentioned object, a fourth semiconductor memory device of the present invention includes: a memory cell array in which memory cells are arranged in a matrix; a plurality of word lines connecting gate terminals of memory cells commonly in a row direction; a plurality of bit lines connecting drain terminals of memory cells commonly in a column direction; a determination circuit (determination inverter, buffering inverter) for determining data of the memory cells; a column selection circuit (column decoder) for selectively connecting the bit lines to the determination circuit; a charging circuit for charging the bit line selected by the column selection circuit and an input terminal of the determination circuit; and a first charge signal generation circuit for controlling the charging circuit. The device further includes: a dummy memory cell array in which dummy memory cells are arranged in a column direction; a dummy bit line connecting drain terminals of the dummy memory cells; a dummy determination circuit; a dummy selection circuit for connecting the dummy bit line to the dummy determination circuit; a dummy charging circuit having the same internal configuration as that of the charging circuit, for receiving an output signal (NPR) of the first charge signal generation circuit and charging the dummy bit line connected through the dummy selection circuit and an input terminal of the dummy determination circuit; and a second charge signal generation circuit (e.g., OR circuit) for receiving an output signal (DMOUT) of the dummy determination circuit and an output signal (NPR) of the first charge signal generation circuit to control the charging circuit. The charging circuit includes: a first charging subcircuit that is operated when the output signal (NPR) of the first charge signal generation circuit is in an active state; and a second charging subcircuit that is operated when the output signal (NPR) of the first charge signal generation circuit is in an active state and the output signal (DMOUT) of the dummy determination circuit is in a predetermined logic state.

According to the above configuration, until the output signal (DMOUT) of the dummy determination circuit is changed, the second charging unit is operated in addition to the first charging unit to charge a selected bit line. After the output signal (DMOUT) of the dummy determination circuit is changed, the selected bit line is charged only by the first charging unit.

In order to achieve the above-mentioned object, a fifth semiconductor memory device of the present invention includes: a memory cell array in which memory cells are arranged in a matrix; a plurality of word lines connecting gate terminals of memory cells commonly in a row direction; a plurality of bit lines connecting drain terminals of memory cells commonly in a column direction; a determination circuit (determination inverter, buffering inverter) for determining data of the memory cells; a column selection circuit (column decoder) for selectively connecting the bit lines to the determination circuit; a charging circuit for charging the bit line selected by the column selection circuit and an input terminal of the determination circuit; and a first charge signal generation circuit for controlling the charging circuit. The device further includes: a dummy memory cell array in which dummy memory cells are arranged in a column direction; a dummy bit lines connecting drain terminals of the dummy memory cells; a dummy determination circuit; a dummy selection circuit for connecting the dummy bit lines to the dummy determination circuit; a dummy charging circuit having the same internal configuration as that of the charging circuit, for receiving an output signal (NPR) of the first charge signal generation circuit and charging the dummy bit line connected through the dummy selection circuit and an input terminal of the dummy determination circuit; and a second charge signal generation circuit for receiving an output signal (DMOUT) of the dummy determination circuit and the output signal (NPR) of the first charge signal generation circuit to control the charging circuit. The charging circuit includes: a first transistor (e.g., a P-type transistor for charging) having a source terminal supplied with a supply voltage (VDD), a gate terminal supplied with the output signal (NPR) of the first charge signal generation circuit, and a drain terminal connected to the input terminal of the determination circuit; and a second transistor having a source terminal supplied with the supply voltage (VDD), a gate terminal supplied with an output signal (NPR2) of the second charge signal generation circuit, and a drain terminal connected to the input terminal of the determination circuit.

According to the above configuration, until the output signal (DMOUT) of the dummy determination circuit is changed, the second transistor is operated in addition to the first transistor to charge a selected bit line. After the output signal (DMOUT) of the dummy determination circuit is changed, the selected bit line is charged only by the first transistor.

According to the above-mentioned Embodiments 1 to 3, by adding a charging circuit for charging a bit line up to a switching level VTH of a determination inverter for determining data of a memory cell, the bit line can be charged rapidly up to the switching level of the inverter for determining data of a memory cell. Therefore, even when the current capability of the charging circuit is decreased and the bit line capacitance is increased, a charge time can be shortened, whereby high-speed reading can be performed.

Furthermore, according to the above-mentioned Embodiments 4 and 5, by controlling the ON time of a dummy charging circuit by a dummy memory cell array and a dummy sense amplifier, a bit line can be charged rapidly until the output signal DMOUT of the dummy determination circuit is changed. Therefore, even when the current capability of the charging circuit is decreased and the bit line capacitance is increased, a charge time can be shortened, whereby high-speed reading can be performed.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of preferred embodiments with reference to the drawings.

Embodiment 1

Figure 1:
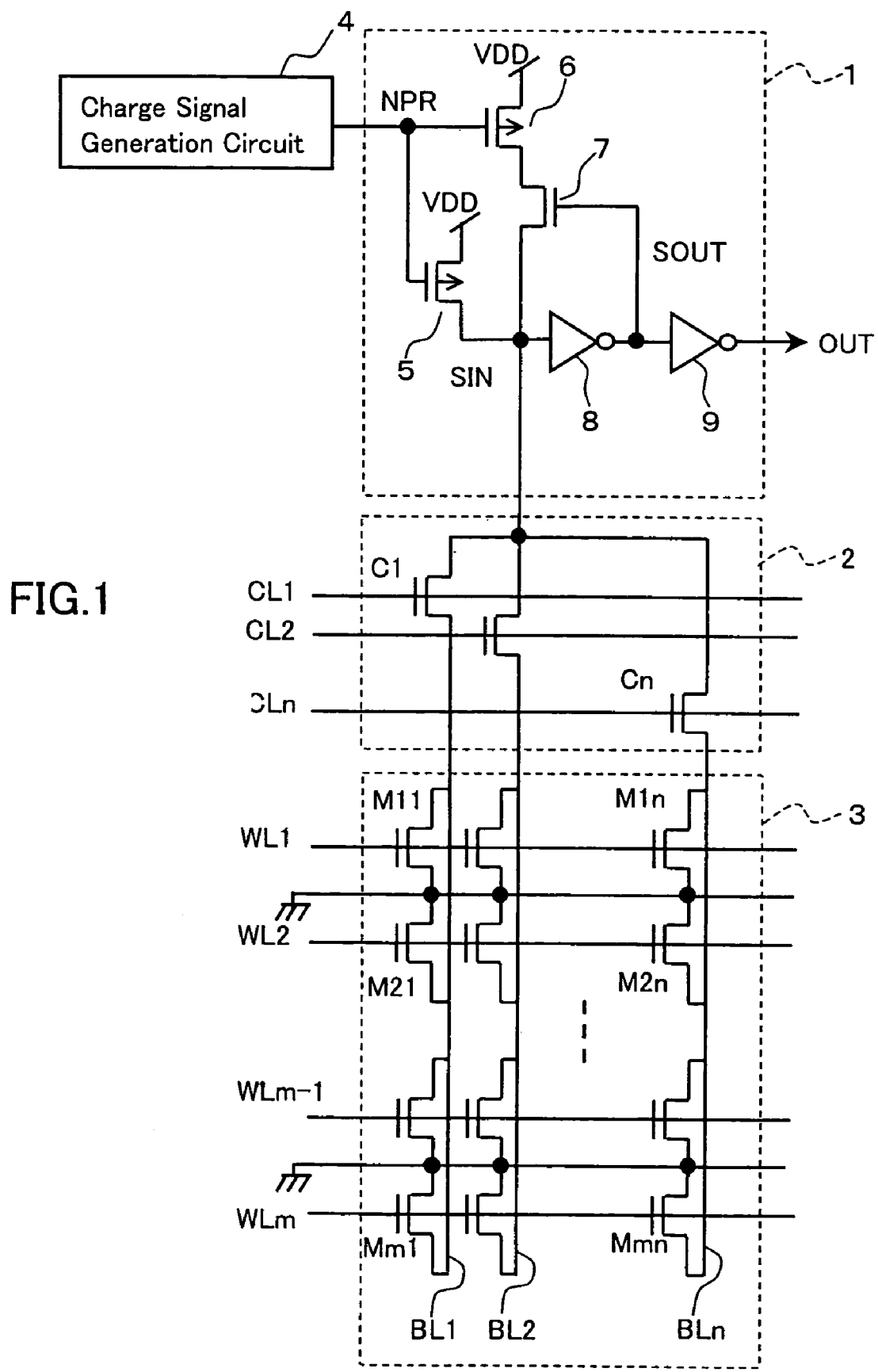
FIG. 1 is a circuit diagram showing an exemplary configuration of a semiconductor memory device according to Embodiment 1 of the present invention.

FIG. 1 is a circuit diagram showing an exemplary configuration of a semiconductor memory device according to Embodiment 1 of the present invention.

In FIG. 1, the semiconductor memory device includes a sense amplifier 1, a column decoder 2, a memory cell array 3, and a charge signal generation circuit 4. The sense amplifier 1 includes a P-type MOS transistor 5 for charging, a P-type MOS transistor 6, a N-type MOS transistor 7, a determination inverter 8, and a buffering inverter 9. The column decoder 2, the memory cell array 3, the charge signal generation circuit 4, the P-type MOS transistor 5 for charging, the determination inverter 8, and the buffering inverter 9 are the same as those in the conventional example shown in FIG. 6. These components are denoted with the same reference numerals as those in FIG. 6, and the description thereof will be omitted here.

The P-type MOS transistor 6 has a source for receiving a supply voltage VDD and a gate to which a charge control signal NPR output from the charge signal generation circuit 4 is applied. The N-type MOS transistor 7 has a source connected to a drain of the P-type MOS transistor 6, a gate connected to an output terminal of the determination inverter 8, and a drain connected to an input terminal of the determination inverter 8.

Figure 2:
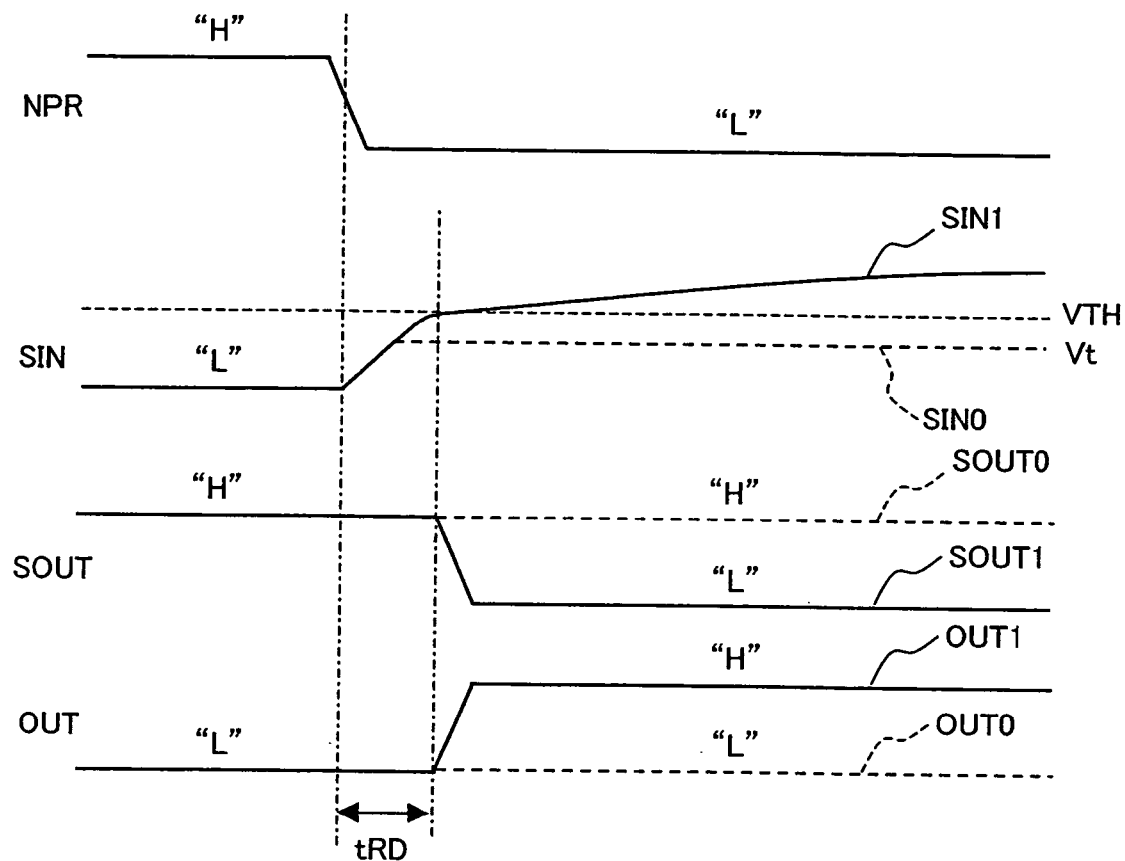
FIG. 2 is a timing chart for signals in respective portions of a sense amplifier 1 shown in FIG. 1.

Next, the operation of reading data of a memory cell M11, as an example, in the semiconductor memory device configured as described above will be described with reference to FIG. 2. FIG. 2 is a timing chart for signals in respective portions of the sense amplifier 1.

First, among column selection signal lines CLj (j=1 to n), CL1 is changed to a logic "H" level, and the other CL2 to CLn are changed to a logic "L" level, whereby a N-type MOS transistor C1 is turned on among the transistors constituting the column decoder 2, and the other transistors C2 to Cn are turned off. Furthermore, a word line WL1 is changed from the logic "L" level that is a non-selected state to the logic "H" level that is a selected state, and the other word lines WL2 to WLm are retained to be the logic "L" level that is a non-selected state.

Next, the charge control signal NPR is changed from the logic "H" level to the logic "L" level, and the P-type MOS transistor 5 for charging and the P-type MOS transistor 6 are turned on.

Herein, in the case where a drain of the memory cell M11 is connected to a bit line BL1, the level of an input signal SIN (SIN0) of the determination inverter 8 is determined based on the relationship between the charge current capability of the P-type MOS transistor 6 via the N-type MOS transistor 7 and the P-type MOS transistor 5 for charging, and the discharge current capability of the memory cell M11. When the level of the input signal SIN0 of the determination inverter 8 exceeds a threshold value Vt of the N-type MOS transistor constituting the determination inverter 8, an output signal SOUT (SOUT0) of the determination inverter 8 decreases from a supply voltage VDD level. Consequently, the gate level of the N-type MOS transistor 7 decreases, and the charge current capability of the P-type MOS transistor 6 via the N-type MOS transistor 7 becomes small.

The input signal SIN0 of the determination inverter 8 reaches a level at which the charge current capability of the P-type MOS transistor 6 via the N-type MOS transistor 7 and the P-type MOS transistor 5 for charging is in balance with the discharge current capability of the memory cell M11. The size of the N-type MOS transistor 7 previously is set so that the balance level is lower than a switching level VTH of the determination inverter 8. Therefore, the level of the input signal SIN0 of the determination inverter 8 is lower than the switching level VTH. Consequently, the output signal of the determination inverter 8 holds the logic "H" level, and the output signal of the buffering inverter 9 holds the logic "L" level.

On the other hand, in the case where the drain of the memory cell M11 is not connected to the bit line BL1, the output signal SOUT (SOUT1) of the determination inverter 8 holds the logic "H" until the level of the input signal SIN (SIN1) of the determination inverter 8 reaches the switching level VTH of the determination inverter 8. Therefore, the bit line BL1 is charged by the P-type MOS transistor 6 via the N-type MOS transistor 7 and the P-type MOS transistor 5 for charging.

However, when the level of the input signal SIN1 of the determination inverter 8 reaches the switching level VTH of the determination inverter 8, the output signal SOUT (SOUT1) of the determination inverter 8 is changed from the logic "H" level to the logic "L" level, and the N-type MOS transistor 7 is turned off. Therefore, the bit line BL1 is charged only by the P-type MOS transistor 5 for charging. At this time, the output signal OUT (OUT1) of the buffering inverter 9 is changed from the logic "L" level to the logic "H" level.

As described above, according to the present embodiment, a bit line is charged by both the P-type MOS transistor 6 via the N-type MOS transistor 7 and the P-type MOS transistor 5 for charging until the level of the input signal SIN of the determination inverter 8 reaches the switching level VTH, whereby a charge time is shortened. Consequently, a read time is shortened, and high-speed reading can be performed.

Embodiment 2

Figure 3:
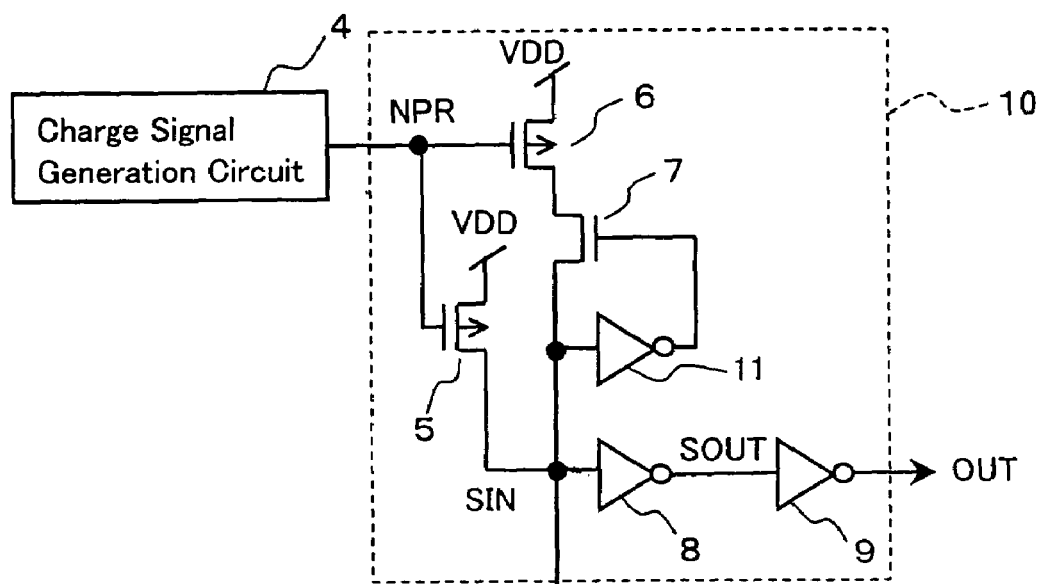
FIG. 3 is a circuit diagram showing an exemplary configuration of a semiconductor memory device according to Embodiment 2 of the present invention.
Figure 3:
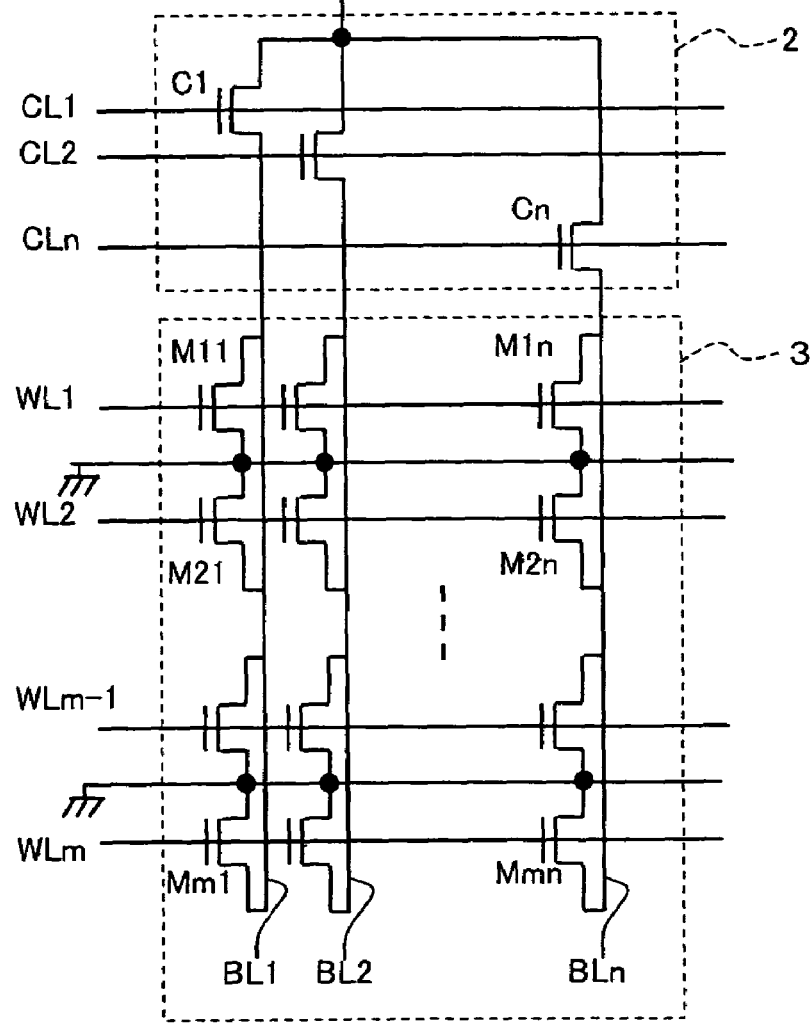

FIG. 3 is a circuit diagram showing an exemplary configuration of a semiconductor memory device according to Embodiment 2 of the present invention.

In FIG. 3, the semiconductor memory device includes a sense amplifier 10, a column decoder 2, a memory cell array 3, and a charge signal generation circuit 4. The sense amplifier 10 includes a P-type MOS transistor 5 for charging, a P-type MOS transistor 6, a N-type MOS transistor 7, a determination inverter 8, a buffering inverter 9, and an inverter 11.

The column decoder 2, the memory cell array 3, the charge signal generation circuit 4, the P-type MOS transistor 5 for charging, the P-type MOS transistor 6, the N-type MOS transistor 7, the determination inverter 8, and the buffering inverter 9 are the same as those in Embodiment 1 shown in FIG. 1. These components are denoted with the same reference numerals as those in FIG. 1, and the description thereof will be omitted here.

In the sense amplifier 10, the inverter 11 receives an input signal SIN of the determination inverter 8, and applies an output signal to a gate of the N-type MOS transistor 7. Furthermore, a switching level of the inverter 11 is lower than the switching level VTH of the determination inverter 8.

Next, the operation of reading data of a memory cell M11, as an example, in the semiconductor memory device configured as described above will be described. The reading operation is the same as that in Embodiment 1 shown in FIG. 2.

First, among column selection signal lines CLj (j=1 to n), CL1 is changed to a logic "H" level, and the other CL2 to CLn are changed to a logic "L" level, whereby a N-type MOS transistor C1 is turned on among the transistors constituting the column decoder 2, and the other transistors C2 to Cn are turned off. Furthermore, a word line WL1 is changed from the logic "L" level that is a non-selected state to the logic "H" level that is a selected state, and the other word lines WL2 to WLm are retained to be the logic "L" level that is a non-selected state.

Next, a charge control signal NPR is changed from the logic "H" level to the logic "L" level, and the P-type MOS transistor 5 for charging and the P-type MOS transistor 6 are both turned on.

Herein, in the case where a drain of the memory cell M11 is connected to a bit line BL1, the level of an input signal SIN (SIN0) of the determination inverter 8 and the inverter 11 is determined based on the relationship between the charge current capability of the P-type MOS transistor 6 via the N-type MOS transistor 7, and the P-type MOS transistor 5 for charging and the discharge current capability of the memory cell M11.

When the level of the input signal SIN0 approaches the switching level of the inverter 11, an output signal of the inverter 11 is changed from the logic "H" level to the logic "L" level, and the N-type MOS transistor 7 is changed from an ON state to an OFF state. Therefore, the charge current from the P-type MOS transistor 6 ceases, and the level of the input signal of the determination inverter 8 and the inverter 11 is determined based on the relationship between the charge current capability of the P-type MOS transistor 5 for charging and the discharge current capability of the memory cell M11. The level of the input signal SIN0 becomes lower than the switching level VTH of the determination inverter 8. Consequently, the output signal SOUT (SOUT0) of the determination inverter 8 holds the logic "H" level, and the output signal OUT (OUT0) of the buffering inverter 9 holds the logic "L" level.

On the other hand, in the case where the drain of the memory cell M11 is not connected to the bit line BL1, the bit line BL1 is charged by the P-type MOS transistor 6 via the N-type MOS transistor 7 and the P-type MOS transistor 5 for charging until the level of the input signal SIN (SIN1) of the determination inverter 8 and the inverter 11 reaches the switching level of the inverter 11. When the level of the input signal SIN1 of the determination inverter 8 and the inverter 11 reaches the switching level of the inverter 11, the output signal of the inverter 11 is changed from the logic "H" level to the logic "L" level, and the N-type MOS transistor 7 is turned off. Therefore, the bit line BL1 is charged only by the P-type MOS transistor 5 for charging. The input signal SIN1 of the determination inverter 8 and the inverter 11 reaches a level higher than a switching level VTH of the inverter 8. Therefore, the output signal of the inverter 8 reaches the logic "L" level, and the output signal of the buffering inverter 9 reaches the logic "H" level.

As described above, according to the present embodiment, a bit line is charged by both the P-type MOS transistor 6 via the N-type MOS transistor 7 and the P-type MOS transistor 5 for charging until the level of the input signal SIN of the determination inverter 8 reaches the switching level of the inverter 11, whereby a charge time is shortened. Consequently, a read time is shortened, and high-speed reading can be performed.

Furthermore, the switching level of the inverter 11 is lower than the switching level VTH of the determination inverter 8. Therefore, the difference between the level of the input signal SIN of the determination inverter 8 and the switching level VTH of the determination inverter 8 in the case where the drain of the memory cell M11 is connected to the bit line BL1 can be made larger than that in Embodiment 1. Consequently, a stable operation can be performed.

Embodiment 3

Figure 4:
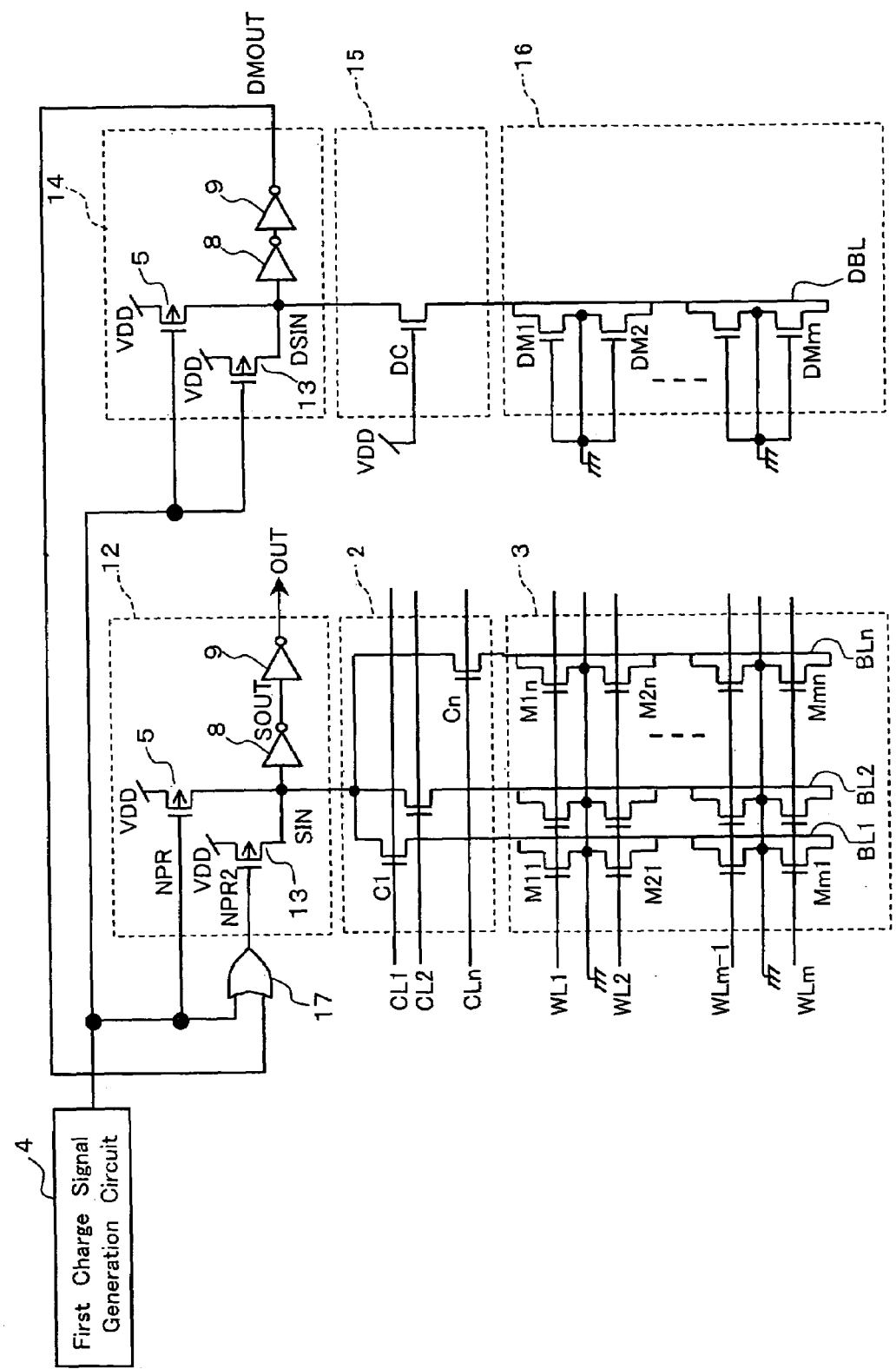
FIG. 4 is a circuit diagram showing an exemplary configuration of a semiconductor memory device according to Embodiment 3 of the present invention.

FIG. 4 is a circuit diagram showing an exemplary configuration of a semiconductor memory device according to Embodiment 3 of the present invention.

In FIG. 4, the semiconductor memory device includes a sense amplifier 12, a column decoder 2, a memory cell array 3, a first charge signal generation circuit 4, a dummy sense amplifier 14, a dummy column decoder 15, a dummy memory cell array 16, and a second charge signal generation circuit (OR circuit) 17.

Figure 6:
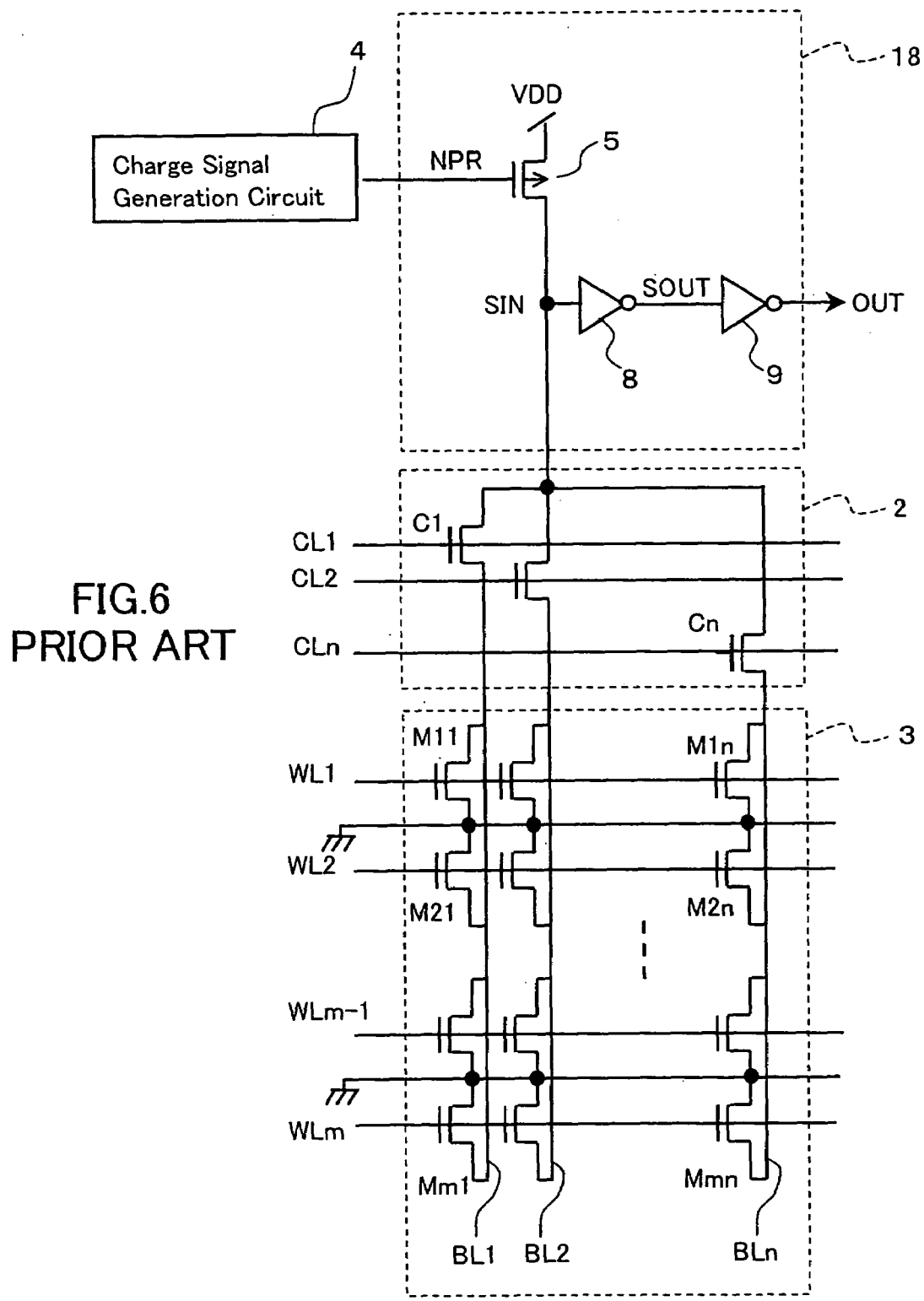
FIG. 6 is a circuit diagram showing an exemplary configuration of a conventional semiconductor memory device.
Figure 7:
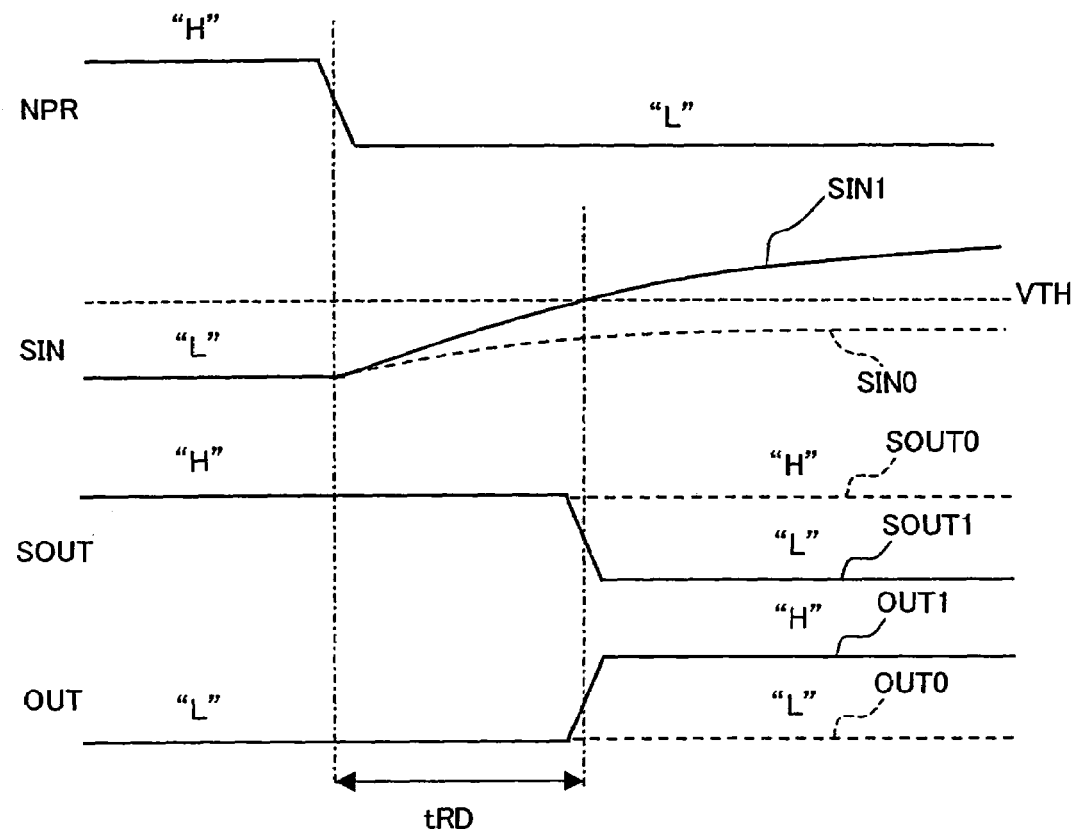
FIG. 7 is a timing chart for signals in respective portions of a sense amplifier 18 shown in FIG. 6.

The column decoder 2, the memory cell array 3, the first charge signal generation circuit 4, the P-type MOS transistor 5 for charging, the determination inverter 8, and the buffering inverter 9 are the same as those in the conventional example shown in FIG. 6. These components are denoted with the same reference numerals as those in FIG. 6, and the description thereof will be omitted here.

The P-type MOS transistor 13 constituting the sense amplifier 12 has a source connected to a supply voltage VDD, a gate to which a charge control signal NPR2 output from the second charge signal generation circuit 17 is applied, and a drain connected to an input terminal of the determination inverter 8. Furthermore, the current capability of the P-type MOS transistor 13 is larger than that of memory cells Mij.

The dummy sense amplifier 14 has the same configuration as that of the sense amplifier 12, gates of the P-type MOS transistor 5 for charging and the P-type MOS transistor 13 in the dummy sense amplifier 14 receive a charge control signal NPR of the first charge signal generation circuit 4, and supply an output signal DMOUT to the second charge signal generation circuit 17.

The dummy column decoder 15 is composed of a N-type MOS transistor DC. A drain of the N-type MOS transistor DC is connected to an input terminal of the determination inverter 8, a gate thereof receives the supply voltage VDD, and a source thereof is connected to a dummy bit line DBL.

The dummy memory cell array 16 has a configuration in which dummy memory cells DMj (j=1 to m) of the N-type MOS transistor are arranged. A gate of the dummy memory cell DMj is grounded, a drain thereof is connected to the dummy bit line DBL, and a source thereof is grounded.

The second charge signal generation circuit 17 receives the charge control signal NPR from the first charge signal generation circuit and the output signal DMOUT of the dummy sense amplifier 14 to output the charge control signal NPR 2 to the gate of the P-type MOS transistor 13.

Figure 5:
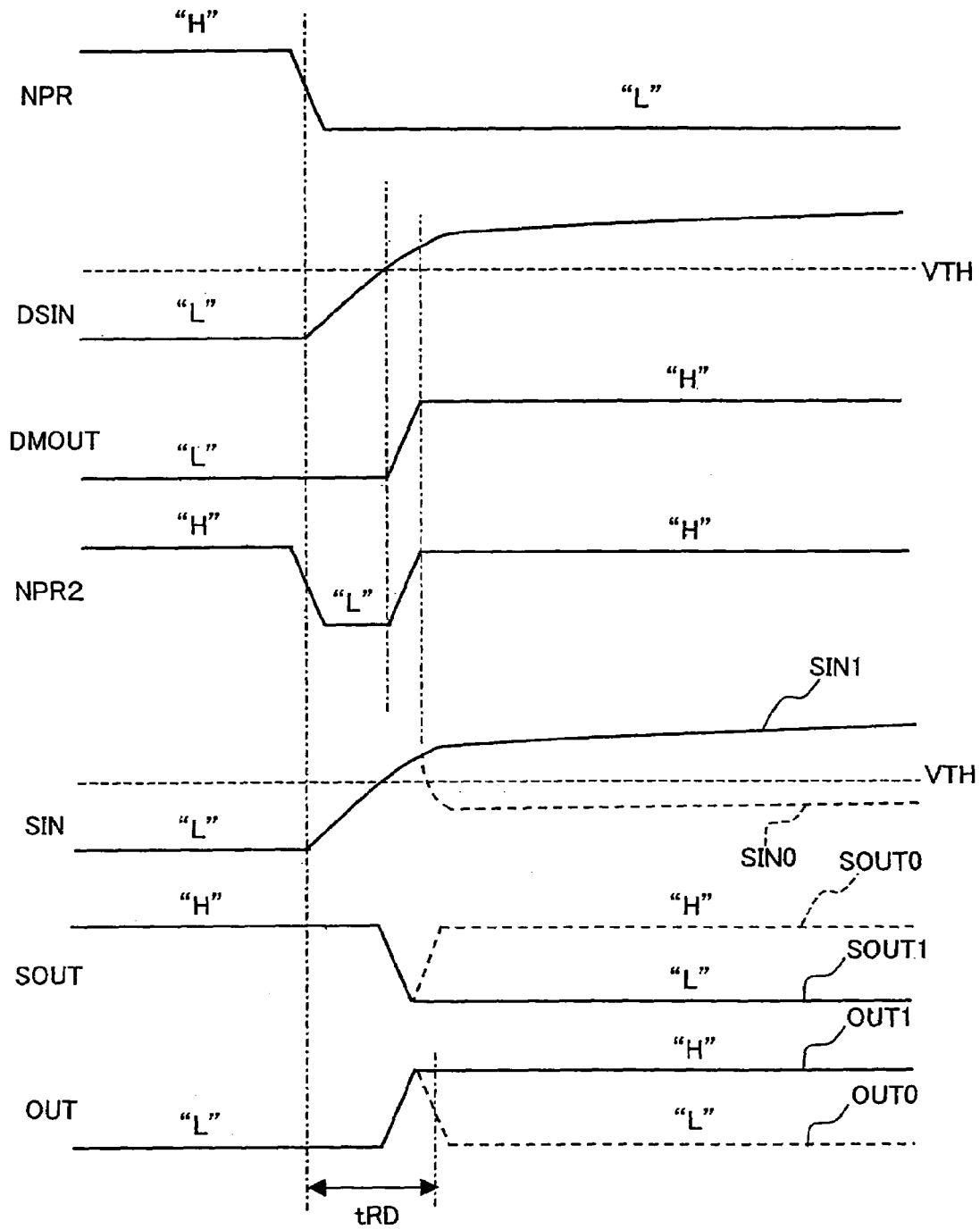
FIG. 5 is a timing chart for signals in respective portions of the semiconductor memory device shown in FIG. 4.

Next, the operation of reading data of the memory cell M11, as an example, in the semiconductor memory device configured as described above will be described with reference to FIG. 5. FIG. 5 is a timing chart for signals in respective portions of the semiconductor device shown in FIG. 4.

First, among column selection signal lines CLj (j=1 to n), CL1 is changed to a logic "H" level, and the other CL2 to CLn are changed to a logic "L" level, whereby the N-type MOS transistor C1 is turned on among the transistors constituting the column decoder 2, and the other transistors C2 to Cn are turned off. Furthermore, the word line WL1 is changed from the logic "L" level that is a non-selected state to the logic "H" level that is a selected state, and the other word lines WL2 to WLm are retained to be the logic "L" level that is a non-selected state. The output signal DMOUT of the dummy sense amplifier 14 starts its operation from the logic "L" level.

Then, the charge control signal NPR is changed from the logic "H" level to the logic "L" level. The P-type MOS transistor 5 for charging of the sense amplifier 12 and the P-type MOS transistor 5 for charging, and the P-type MOS transistor 13 of the dummy sense amplifier 14 are turned on. Furthermore, the charge control signal NPR 2 of the second charge signal generation circuit 17 also is changed from the logic "H" level to the logic "L" level. Therefore, the P-type MOS transistor 13 of the sense amplifier 12 is turned on.

The dummy sense amplifier 14 charges the dummy bit line DBL and an input of the determination inverter 8 of the dummy sense amplifier 14 with a charge current of the P-type MOS transistor 5 and the P-type MOS transistor 13 of the dummy sense amplifier 14, whereby the output signal DMOUT is changed from the logic "L" level to the logic "H" level. Consequently, the charge control signal NPR2 of the second charge signal generation circuit 17 is changed from the logic "L" level to the logic "H" level.

Herein, in the case where a drain of the memory cell M11 is connected to the bit line BL1, when the charge control signals NPR and NPR2 are both at the logic "L" level, the level of an input signal SIN (SIN0) of the determination inverter 8 is determined based on the relationship between the charge current capability of the P-type MOS transistor 5 and the P-type MOS transistor 13, and the discharge current capability of the memory cell M11. Furthermore, when the charge control signal NPR is at the logic "L" level, and the charge control signal NPR2 is at the logic "H" level, the level of the input signal SIN0 of the determination inverter 8 is determined based on the relationship between the charge current capability of the P-type MOS transistor 5 and the discharge current capability of the memory cell M11.

As described above, when the charge control signals NPR and NPR2 are both at the logic "L" level, the current capability of the P-type MOS transistor 13 is larger than that of the memory cells Mij. Therefore, the input signal SIN0 of the determination inverter 8 reaches a switching level VTH of the determination inverter 8. Consequently, the output signal OUT of the sense amplifier 12 is changed from the logic "L" level to the logic "H" level.

Next, when the charge control signal NPR2 reaches the logic "H" level, the P-type MOS transistor 13 of the sense amplifier 12 is turned off. Therefore, the input signal SIN0 of the determination inverter 8 becomes lower than the switching level VTH of the determination inverter 8. Consequently, the output signal OUT of the sense amplifier 12 is changed from the logic "H" level to the logic "L" level.

On the other hand, in the case where the drain of the memory cell M11 is not connected to the bit line BL1, when the charge control signals NPR and NPR2 are both at the logic "L" level, the level of the input signal SIN (SIN1) of the determination inverter 8 is determined based on the charge current capability of the P-type MOS transistor 5 and the P-type MOS transistor 13. Furthermore, when the charge control signal NPR is at the logic "L" level, and the charge control signal NPR2 is at the logic "H" level, the level of the input signal SIN1 of the determination inverter 8 is determined based on the charge current capability of the P-type MOS transistor 5.

As described above, when the charge control signals NPR and NPR2 are both at the logic "L" level, the current capability of the P-type MOS transistor 13 is large. Therefore, the input signal SIN1 of the determination inverter 8 reaches the switching level VTH of the determination inverter 8, and the output signal OUT1 of the sense amplifier 12 is changed from the logic "L" level to the logic "H" level.

Next, when the charge control signal NPR2 reaches the logic "H" level, the P-type MOS transistor 13 of the sense amplifier 12 is turned off. Therefore, the charge current capability is decreased; however, the input signal SIN1 of the determination inverter 8 becomes higher than the switching level VTH of the determination inverter 8, and the output signal OUT1 of the sense amplifier 12 holds the logic "H" level.

As described above, according to the present embodiment, a bit line is charged by the P-type MOS transistor 5 and the P-type MOS transistor 13 until the output signal DMOUT of the dummy sense amplifier 14 reaches the logic "H" level, whereby a charge time is shortened. Consequently, a read time is shortened, and high-speed reading can be performed.

Furthermore, when the output signal DMOUT of the dummy sense amplifier 14 reaches the logic "H" level, a through-current in the case where the drain of the memory cell M11 is connected to the bit line BL1 can be made smaller than that in Embodiments 1 and 2. Therefore, high-speed reading and low current consumption can be realized.

High-speed reading and low current consumption also can be realized even in the following configuration: the sense amplifier 12 and the dummy sense amplifier 14 in the present embodiment are replaced by the sense amplifier 1 in Embodiment 1, the charge control signal NPR is applied to the gate of the P-type MOS transistor 5 for charging, and the charge control signal NPR2 is applied to the gate of the P-type MOS transistor 6.

Furthermore, high-speed reading and low current consumption also can be realized even in the following configuration: the sense amplifier 12 and the dummy sense amplifier 14 in the present embodiment are replaced by the sense amplifier 10 in Embodiment 2, the charge control signal NPR is applied to the gate of the P-type MOS transistor 5 for charging, and the charge control signal NPR2 is applied to the gate of the P-type MOS transistor 6.

As described above, according to the present invention, a circuit that charges a bit line up to a switching level of a circuit for determining data of a memory cell is added, and the ON time of the second charging circuit is controlled by the dummy memory cell array and the dummy sense amplifier, whereby high-speed reading can be realized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device, comprising:
    a memory cell array in which memory cells are arranged in a matrix;
    a plurality of word lines connecting gate terminals of memory cells commonly in a row direction;
    a plurality of bit lines connecting drain terminals of memory cells commonly in a column direction;
    a determination circuit for determining data of the memory cells;
    a column selection circuit for selectively connecting the bit lines to the determination circuit;
    a charging circuit for charging the bit line selected by the column selection circuit and an input terminal of the determination circuit; and
    a charge signal generation circuit for controlling the charging circuit,
    wherein the charging circuit includes:
    a first charging subcircuit that is operated when an output signal of the charge signal generation circuit is in an active state; and
    a second charging subcircuit that is operated when the output signal of the charge signal generation circuit is in an active state and a voltage of the selected bit line is lower than a predetermined voltage.

2. A semiconductor memory device, comprising:
    a memory cell array in which memory cells are arranged in a matrix;
    a plurality of word lines connecting gate terminals of memory cells commonly in a row direction;
    a plurality of bit lines connecting drain terminals of memory cells commonly in a column direction;
    a determination circuit for determining data of the memory cells;
    a column selection circuit for selectively connecting the bit lines to the determination circuit;
    a charging circuit for charging the bit line selected by the column selection circuit and an input terminal of the determination circuit; and
    a charge signal generation circuit for controlling the charging circuit,
    wherein the charging circuit includes:
    a first transistor having a source terminal supplied with a supply voltage, a gate terminal supplied with an output signal of the charge signal generation circuit, and a drain terminal connected to an input terminal of the determination circuit;

a second transistor having a source terminal supplied with the supply voltage and a gate terminal supplied with the output signal of the charge signal generation circuit; and a third transistor having a source terminal connected to a drain terminal of the second transistor, a gate terminal connected to the output terminal of the determination circuit, and a drain terminal connected to the input terminal of the determination circuit.

3. A semiconductor memory device, comprising:

a memory cell array in which memory cells are arranged in a matrix;

a plurality of word lines connecting gate terminals of memory cells commonly in a row direction;

a plurality of bit lines connecting drain terminals of memory cells commonly in a column direction;

a determination circuit for determining data of the memory cells;

a column selection circuit for selectively connecting the bit lines to the determination circuit;

a charging circuit for charging the bit line selected by the column selection circuit and an input terminal of the determination circuit; and a charge signal generation circuit for controlling the charging circuit, wherein the charging circuit includes:

a first transistor having a source terminal supplied with a supply voltage, a gate terminal supplied with an output signal of the charge signal generation circuit, and a drain terminal connected to an input terminal of the determination circuit;

a second transistor having a source terminal supplied with the supply voltage and a gate terminal supplied with the output signal of the charge signal generation circuit;

a third transistor having a source terminal connected to a drain terminal of the second transistor and a drain terminal connected to the input terminal of the determination circuit; and an inverter having an input terminal connected to the input terminal of the determination circuit and an output terminal connected to a gate terminal of the third transistor.

* * * * *